US012622259B2

(12) United States Patent (10) Patent No.: US 12,622,259 B2

Lu (45) Date of Patent: May 5, 2026

(54) METHOD FOR FABRICATING SEMICONDUCTOR STRUCTURE, AND SEMICONDUCTOR STRUCTURE

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 371 days.

(21) Appl. No.: 18/365,154

(22) Filed: Aug. 3, 2023

(65) Prior Publication Data

US 2024/0021518 A1     Jan. 18, 2024

Related U.S. Application Data

(63) Continuation of application No. PCT/CN2021/125802, filed on Oct. 22, 2021.

(30) Foreign Application Priority Data

Aug. 27, 2021     (CN) .......................... 202110995019.4

(51) Int. Cl.
 *H10B 12/00*     (2023.01)
 *H10W 20/00*     (2026.01)
 *H10W 20/43*     (2026.01)

(52) U.S. Cl.
 CPC ............ *H10W 20/43* (2026.01); *H10B 12/03* (2023.02); *H10B 12/482* (2023.02); *H10B 12/488* (2023.02); *H10W 20/056* (2026.01)

(58) Field of Classification Search
 CPC .... H10W 20/43; H10W 20/056; H10B 12/03; H10B 12/482; H10B 12/488; H10B 12/485
 See application file for complete search history.

(56) References Cited

U.S. PATENT DOCUMENTS

2003/0205748 A1    11/2003  Park
2010/0276741 A1*   11/2010  Wells ..................... H10B 12/31
                                                                      257/302

(Continued)

FOREIGN PATENT DOCUMENTS

CN        111223862  A      6/2020
CN        111640749  A      9/2020

(Continued)

OTHER PUBLICATIONS

ISA State Intellectual Property Office of the People's Republic of China, International Search Report Issued in Application No. PCT/CN2021/125802, May 26, 2022, WIPO, 4 pages.

*Primary Examiner* — Samuel Park

(74) *Attorney, Agent, or Firm* — Kilpatrick Townsend & Stockton LLP

(57)     ABSTRACT

Embodiments are a method for fabricating a semiconductor structure. The method includes: providing a substrate; etching the substrate to form bit line grooves extending along a first direction; sequentially forming a first isolation layer, a bit line metal line layer, a bit line conductive connection layer and a first insulating layer to obtain a bit line structure; etching to form a substrate of the bit line structure, and to obtain a plurality of active area structures arranged at intervals and a first groove, the bit line structure intersecting with the active area structures; filling the first groove with a second isolation layer to obtain a first structure; etching the first structure to form word line grooves extending along a direction perpendicular to the first direction; and sequentially forming a third isolation layer, a word line conductive connection layer and a second insulating layer in the word line groove.

14 Claims, 12 Drawing Sheets

(56) References Cited

U.S. PATENT DOCUMENTS

| | | | | |
|---|---|---|---|---|
| 2012/0074518 A1* | 3/2012 | Kim | .................... | H10B 12/488 |
| | | | | 257/E27.013 |
| 2013/0015551 A1* | 1/2013 | Wang | .................... | H10B 12/48 |
| | | | | 257/E27.07 |
| 2013/0234282 A1* | 9/2013 | Park | ..................... | H10D 30/63 |
| | | | | 257/508 |
| 2013/0320542 A1* | 12/2013 | Chang | ................ | H10W 20/021 |
| | | | | 438/653 |
| 2016/0197084 A1* | 7/2016 | Yoon | .................. | H10B 12/053 |
| | | | | 438/270 |
| 2018/0083011 A1* | 3/2018 | Wang | ................. | H10B 12/485 |

FOREIGN PATENT DOCUMENTS

| | | | |
|---|---|---|---|
| CN | 111640750 A | 9/2020 |
| CN | 112018115 A | 12/2020 |

* cited by examiner

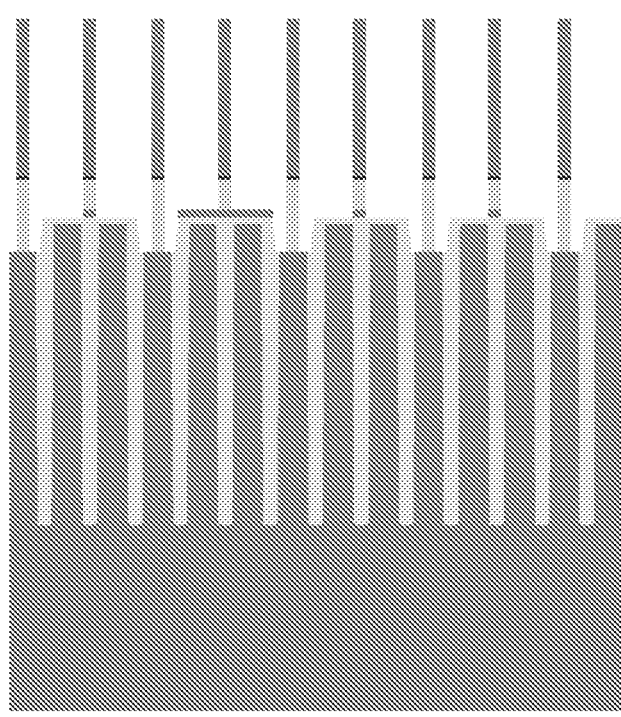

Fig. 1

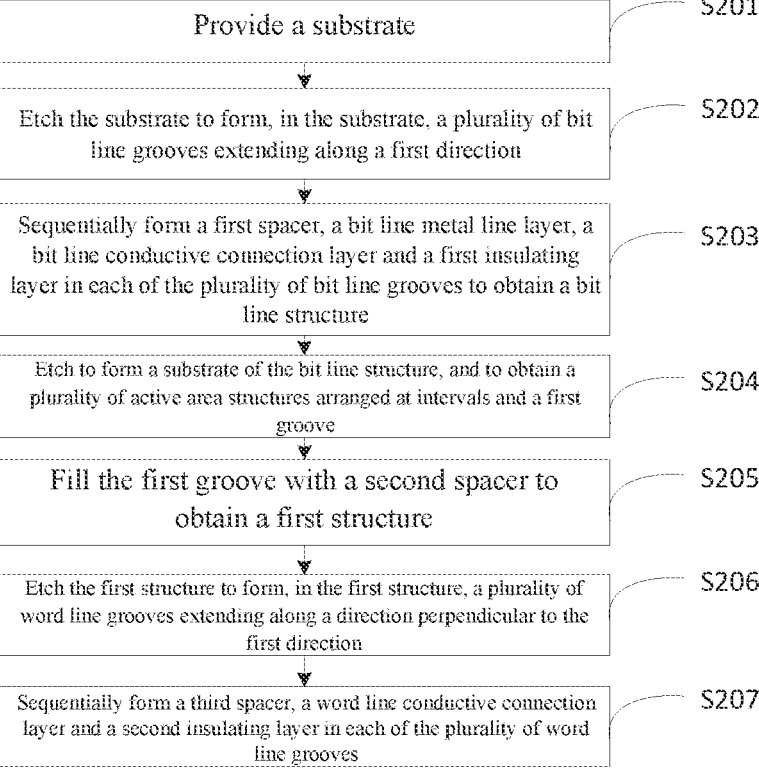

| | |
|---|---|
| Provide a substrate | S201 |
| Etch the substrate to form, in the substrate, a plurality of bit line grooves extending along a first direction | S202 |
| Sequentially form a first spacer, a bit line metal line layer, a bit line conductive connection layer and a first insulating layer in each of the plurality of bit line grooves to obtain a bit line structure | S203 |
| Etch to form a substrate of the bit line structure, and to obtain a plurality of active area structures arranged at intervals and a first groove | S204 |
| Fill the first groove with a second spacer to obtain a first structure | S205 |
| Etch the first structure to form, in the first structure, a plurality of word line grooves extending along a direction perpendicular to the first direction | S206 |
| Sequentially form a third spacer, a word line conductive connection layer and a second insulating layer in each of the plurality of word line grooves | S207 |

Fig. 2

METHOD FOR FABRICATING SEMICONDUCTOR STRUCTURE, AND SEMICONDUCTOR STRUCTURE

CROSS-REFERENCE TO RELATED APPLICATION

This application is a continuation of PCT/CN2021/125802, filed on Oct. 22, 2021, which claims priority to Chinese Patent Application No. 202110995019.4 titled "METHOD FOR FABRICATING SEMICONDUCTOR STRUCTURE, AND SEMICONDUCTOR STRUCTURE" and filed to the State Intellectual Property Office on Aug. 27, 2021, the entire contents of which are incorporated herein by reference.

TECHNICAL FIELD

The present disclosure relates to the field of semiconductor technology, and more particularly, to a method for fabricating a semiconductor structure, and the semiconductor structure.

BACKGROUND

As a semiconductor memory that randomly writes and reads data at a high speed, a dynamic random access memory (DRAM) is widely used in data storage devices or apparatuses. The DRAM comprises a plurality of duplicate memory cells, each of which includes a capacitor structure and a transistor, where a gate of the transistor is connected to a word line, a drain of the transistor is connected to a bit line, and a source of the transistor is connected to the capacitor structure. A voltage signal of the word line can control the transistor to be turned on or off, and further, data information stored in the capacitor structure can be read through the bit line, or the data information can be written into the capacitor structure through the bit line for storage.

In the related technologies, in the process of fabricating a semiconductor structure, a word line is first fabricated to obtain a word line structure, then a plurality of layers are deposited on the word line structure, and a bit line is formed by etching the plurality of layers for many times. However, multiple etching of the plurality of layers may cause the formed bit line to be narrower at a top and wider at a bottom, which may reduce performance of the semiconductor structure.

SUMMARY

According to some embodiments, a first aspect of the present disclosure provides a method of fabricating a semiconductor structure to improve performance of the semiconductor structure. Technical solutions of the present disclosure include: providing a substrate; etching the substrate to form, in the substrate, a plurality of bit line grooves extending along a first direction; sequentially forming a first isolation layer, a bit line metal line layer, a bit line conductive connection layer and a first insulating layer in each of the plurality of bit line grooves to obtain a bit line structure; etching the substrate in which the bit line structure is formed to obtain a plurality of active area structures arranged at intervals and a first groove, where the bit line structure intersects with the plurality of active area structures, respectively; filling the first groove with a second isolation layer to obtain a first structure; etching the first structure to form, in the first structure, a plurality of word line grooves extending along a direction perpendicular to the first direction; and sequentially forming a third isolation layer, a word line conductive connection layer and a second insulating layer in each of the plurality of word line grooves.

According to some embodiments, a second aspect of the present disclosure provides a semiconductor structure, which includes: a substrate comprising a plurality of active area structures arranged at intervals; a plurality of bit line structures formed in the substrate and extending along a first direction, where each of the plurality of bit line structures includes a first isolation layer, a bit line metal line layer, a bit line conductive connection layer and a first insulating layer sequentially distributed from bottom to top, and each of the plurality of bit line structures intersects with the plurality of active area structures, respectively; a second isolation layer arranged between the plurality of bit line structures; and a plurality of word line structures formed in the substrate and extending along a direction perpendicular to the first direction, where each of the plurality of word line structures includes a third isolation layer, a word line conductive connection layer and a second insulating layer sequentially distributed from bottom to top.

BRIEF DESCRIPTION OF THE DRAWINGS

To describe the technical solutions of the embodiments of the present disclosure or the existing technologies more clearly, the accompanying drawings required for describing the embodiments or the existing technologies will be briefly introduced below. Apparently, the accompanying drawings in the following description are merely some embodiments of the present disclosure. To those of ordinary skills in the art, other accompanying drawings may also be derived from these accompanying drawings.

FIG. 1 is a schematic diagram of a structure obtained by etching a layer to be processed in the related technologies;

FIG. 2 is a flowchart of a method for fabricating a semiconductor structure according to an embodiment of the present disclosure;

REFERENCE NUMERALS IN THE ACCOMPANYING DRAWINGS

Figure 3:
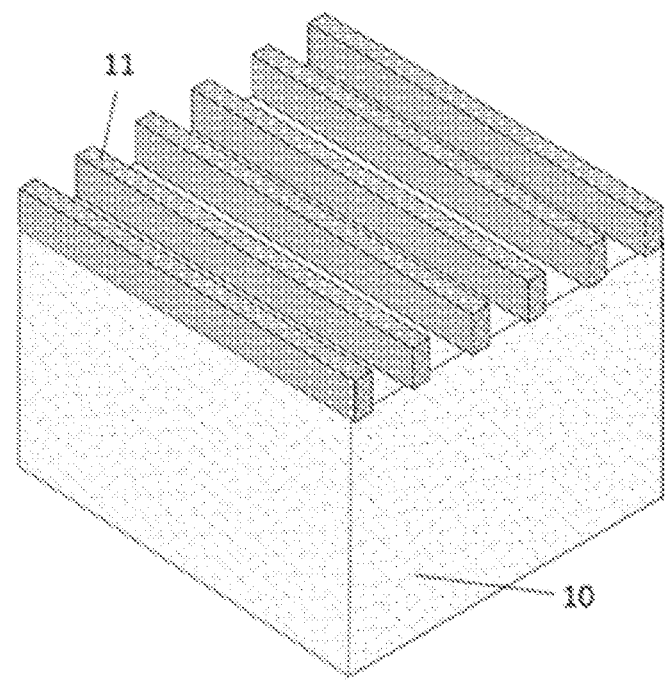
FIG. 3 is a schematic diagram of a structure including a first mask strip according to an embodiment of the present disclosure.

10: substrate;
11: first mask strip;
12: first isolation layer;
121: first sub isolation layer;
122: second sub isolation layer;
13: barrier layer;
14: bit line metal line material layer;
15: bit line conductive connection layer;
16: first insulating layer;
17: active area structure;
18: third mask strip;
19: first isolation structure;
20: second mask strip;
21: second isolation structure;
22: second isolation layer;
23: fourth mask strip;
24: second groove;
25: word line groove;
26: third isolation layer;
27: word line conductive connection layer;
271: first sub word line conductive connection layer;
272: second sub word line conductive connection layer; and
28: second insulating layer.

DETAILED DESCRIPTION

To make the objectives, technical solutions, and advantages of the present disclosure clearer, the present disclosure is further described in detail below with reference to the accompanying drawings and embodiments. Apparently, the described embodiments are merely some but not all of the embodiments of the present disclosure. On the basis of the embodiments of the present disclosure, all other embodiments obtained by those of ordinary skill in the art are within the scope of protection of the present disclosure.

In the related technologies, in the process of fabricating a semiconductor structure, a word line is first fabricated to obtain a word line structure, then a plurality of layers (layers to be processed) are deposited on the word line structure, and a bit line is formed by etching the layers to be processed for many times. However, multiple etching of the layers to be processed may cause the formed bit line to be narrower at a top and wider at a bottom, which may reduce performance of the semiconductor structure.

For example, referring to FIG. 1, FIG. 1 is a schematic diagram of a structure obtained by etching the layer to be processed in the related technologies. An upper part of the structure shown in FIG. 1 is the bit line formed by multiple etching. Because the etching is carried out from top to bottom, it is prone to causing an etching degree of a position near the top of the layer to be processed to be greater than an etching degree of a position near the bottom of the layer to be processed, and thus the obtained bit line is narrower at the top and wider at the bottom, which may reduce the performance of the semiconductor structure.

In view of the above technical problem, an embodiment of the present disclosure provides a method for fabricating a semiconductor structure. Referring to FIG. 2, FIG. 2 is a flowchart of a method for fabricating a semiconductor structure according to an embodiment of the present disclosure. The method may include following steps.

In Step S201, a substrate is provided.

In Step S202, the substrate is etched to form, in the substrate, a plurality of bit line grooves extending along a first direction.

In Step S203, a first isolation layer, a bit line metal line layer, a bit line conductive connection layer and a first insulating layer are sequentially formed in each of the plurality of bit line grooves to obtain a bit line structure.

In Step S204, the substrate in which the bit line structure is formed may be etched to obtain a plurality of active area structures arranged at intervals and a first groove. The bit line structure intersects with the plurality of active area structures, respectively.

In Step S205, the first groove is filled with a second isolation layer to obtain a first structure.

In Step S206, the first structure is etched to form, in the first structure, a plurality of word line grooves extending along a direction perpendicular to the first direction.

In Step S207, a third isolation layer, a word line conductive connection layer and a second insulating layer are sequentially formed in each of the plurality of word line grooves.

Based on the method for fabricating the semiconductor structure according to the embodiment of the present disclosure, a bit line can be obtained by depositing a corresponding material in the bit line groove without multiple etching, thereby avoiding the situation that the bit line is narrower at the top and wider at the bottom due to multiple etching in the related technologies, and thus the performance of the semiconductor structure can be improved.

Next, referring to FIG. 1, because the bit line obtained in the related technologies is a protruding part of the structure, it is prone to causing the protruding part to collapse during etching, which reduces stability of the semiconductor structure. However, according to the method for fabricating the semiconductor structure provided by the embodiment of the present disclosure, the bit line is obtained by depositing the corresponding material in the bit line groove, and the obtained bit line is not the protruding part in the structure, thereby avoiding the collapse of the bit line in the related technologies, and thus the stability of the semiconductor structure can be improved.

With respect to the Step S201, as a supporting component of the semiconductor structure, the substrate is configured to support other components arranged thereon. The substrate may be made of a semiconductor material. For example, the substrate may be silicon, germanium, silicon-germanium compounds, or silicon-carbon compounds, but is not limited thereto.

In one embodiment, the Step S202 may include: forming a first mask layer on the substrate; and etching the substrate covered by the first mask layer to form, in the substrate, a plurality of bit line grooves extending along the first direction.

The first mask layer includes a plurality of first mask strips extending along the first direction, and the plurality of first mask strips are parallel to each other. As an example, referring to FIG. 3, the first mask strip 11 is positioned on the substrate 10, and the first mask strip 11 may be an elongated mask strip.

In one embodiment, a mask material layer is formed on the substrate 10, where the mask material layer may be a photoresist layer. After the photoresist layer is exposed or developed, a first mask layer including a plurality of first mask strips 11 is formed. A portion of the substrate 10 exposed by the first mask layer is etched, such that a plurality of grooves (i.e. bit line grooves in the embodiments of the present disclosure not marked in the figure) can be formed in the substrate 10. A shape of a projection of the bit line groove on an upper surface of the substrate is consistent with a shape of a projection of an opening between adjacent first mask strips 11 on the upper surface of the substrate.

In one embodiment, an isolation layer (which may be referred to as a fourth isolation layer, not marked in the figure) may also be deposited on the substrate 10 before the bit line grooves are formed based on the first mask strips 11. For example, a material of the fourth isolation layer may be silicon nitride, silicon oxide or silicon oxynitride, but is not limited thereto. Next, the substrate 10 is etched on the fourth isolation layer by using the first mask strip 11 as a mask, such that a top of the substrate 10 can be protected by the fourth isolation layer when etching the substrate 10.

For the Step S203, the first isolation layer is configured to isolate the bit line metal line layer from the substrate 10. The plurality of bit line structures obtained may form a bit line. A material of the bit line conductive connection layer may be doped polysilicon. That is, the bit line conductive connection layer is obtained by doping conductive particles in polysilicon, which may be, for example, polysilicon doped with boron particles or polysilicon doped with phosphorus particles. Doping may be achieved by means of diffusion and ion implantation, etc.

The first insulating layer is configured to protect the formed bit line from being oxidized. A material of the first insulating layer may be silicon nitride, silicon oxide or silicon oxynitride, but is not limited thereto. In addition, after the first isolation layer, the bit line metal line layer, the bit line conductive connection layer and the first insulating layer are sequentially formed in the bit line groove, an upper surface of the formed structure is planarized to obtain the bit line structure.

Figure 4:
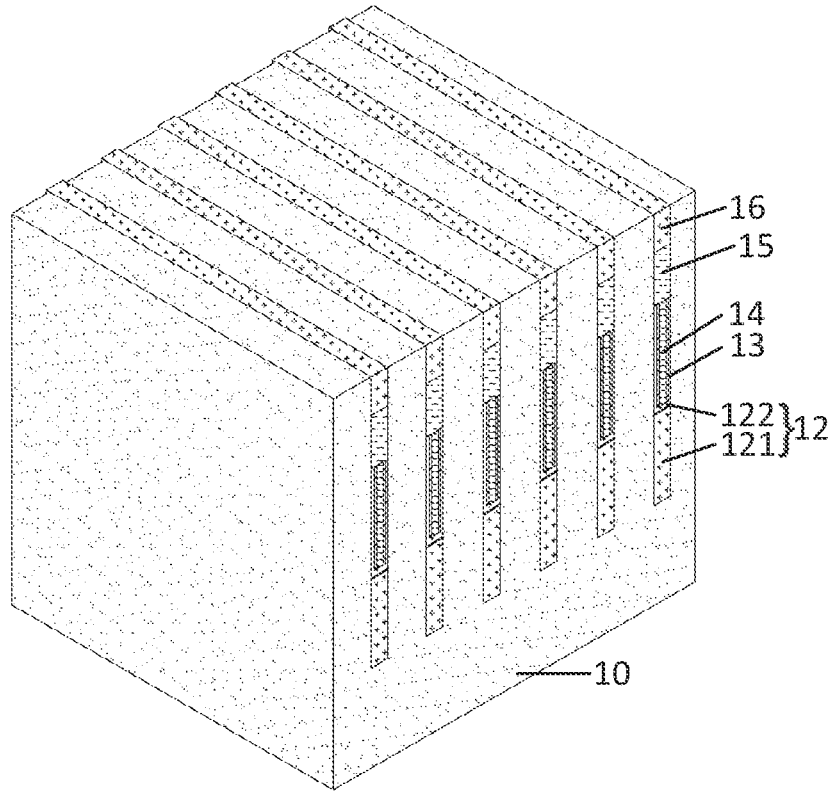
FIG. 4 is a schematic diagram of a substrate for forming a bit line structure according to an embodiment of the present disclosure.

In one embodiment, reference is made to FIG. 4, which is a schematic diagram of the substrate for forming the bit line structure according to an embodiment of the present disclosure. The first isolation layer 12 includes a first sub isolation layer 121 and a second sub isolation layer 122.

Accordingly, the Step S203 may include following steps.

In Step 1, the first sub isolation layer 121 is deposited on the bottom of each of the plurality of bit line grooves.

In Step 2, the second sub isolation layer 122 is deposited on the bottom and a side wall of each of the plurality of bit line grooves where the first sub isolation layer 121 is formed.

In Step 3, a barrier layer 13 is deposited on the bottom and the side wall of each of the plurality of bit line grooves where the second sub isolation layer 122 is formed.

In Step 4, a bit line metal line material layer 14 is deposited in each of the plurality of bit line grooves where the barrier layer 13 is formed.

In Step 5, the barrier layer 13 and the bit line metal line material layer 14 are etched back to obtain the bit line metal line layer.

In Step 6, a bit line conductive connection layer 15 is deposited in each of the plurality of bit line grooves where the bit line metal line layer is formed.

In Step 7, a first insulating layer 16 is deposited in each of the plurality of bit line grooves where the bit line conductive connection layer 15 is formed to obtain the bit line structure.

In an embodiment of the present disclosure, referring to FIG. 4, after the plurality of bit line grooves are formed, the first sub isolation layer 121 is deposited on the bottom of each of the plurality of bit line grooves. A material of the first sub isolation layer 121 may be silicon nitride, silicon oxide or silicon oxynitride, but is not limited thereto. Next, the second sub isolation layer 122 is deposited on a top and a side wall of the first sub isolation layer 121 formed in the bit line groove. A material of the second sub isolation layer 122 may be silicon nitride, silicon oxide or silicon oxynitride, but is not limited thereto.

Next, the barrier layer 13 is deposited on a top and a side wall of the second sub isolation layer 122 formed in the bit line groove. A material of the barrier layer 13 may be titanium nitride or cobalt, but is not limited thereto. The barrier layer 13 is configured to isolate the bit line metal line material layer 14 to prevent the bit line metal line material layer 14 from contaminating the substrate. Next, remaining space of the bit line groove is filled with the bit line metal line material layer 14. A material of the bit line metal line material layer 14 may be tungsten, cobalt silicide or titanium, but is not limited thereto.

After the bit line metal line material layer 14 is filled, the barrier layer 13 and the bit line metal line material layer 14 are etched back, i.e., etched to a designated position. The barrier layer 13 and the bit line metal line material layer 14 etched constitute the bit line metal line layer. The designated position may be determined by a technician according to a dimension of the semiconductor structure and actual fabrication requirements. When the barrier layer 13 and the bit line metal line material layer 14 are etched back, the second sub isolation layer 122 is also etched back. That is, the barrier layer 13, the bit line metal line material layer 14 and the second sub isolation layer 122 are simultaneously etched back to the designated position. Next, the bit line conductive connection layer 15 is deposited on the bit line metal line layer formed in the bit line groove, and then the first insulating layer 16 is deposited on the bit line conductive connection layer 15.

In one embodiment, the Step S204 may include: forming a second mask layer on the substrate 10 where the bit line structure is formed; and etching the substrate 10 covered by the second mask layer, to obtain a plurality of active area structures arranged at intervals and a first groove.

The second mask layer includes a plurality of second mask strips arranged at intervals, and a region of each of the plurality of second mask strips intersects with a region of the bit line structure.

Figure 5:
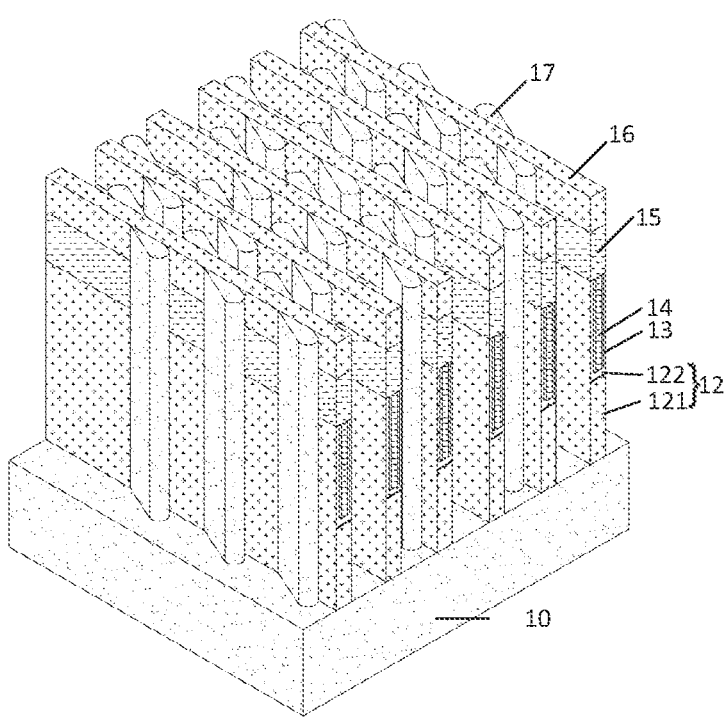
FIG. 5 is a schematic diagram of a structure including an active area structure and a first groove according to an embodiment of the present disclosure.

FIG. 5 is a schematic diagram of a structure including the active area structures and the first groove according to an embodiment of the present disclosure. The structure shown in FIG. 5 includes a plurality of active area structures 17 arranged at intervals. In FIG. 5, the region of the second mask strip is a region corresponding to the active area structure 17, and the region of the first mask strip is a region corresponding to the first insulating layer 16. As can be seen, the regions of the second mask strips intersect with the regions of the bit line structure respectively.

In one embodiment, based on the second mask strips, regions other than the region corresponding to the active area structure 17 and the region corresponding to the bit line structure can be etched to obtain the first groove, and then an insulating material is filled in the first groove to form insulation between the active area structures 17 in the substrate 10. The active area structure 17 is configured to arrange transistors or other components.

In one embodiment, prior to the Step S204, the method may further include following steps.

In Step 1, a third mask layer is provided.

The third mask layer includes a plurality of third mask strips extending along a second direction, and the plurality of third mask strips are parallel to each other.

In Step 2, each of the third mask strips is cut into a plurality of second mask strips with a preset length.

In one embodiment, an angle between the first direction and the second direction is between 15° and 30°. For example, the angle between the first direction and the second direction may be 21°.

Figure 6:
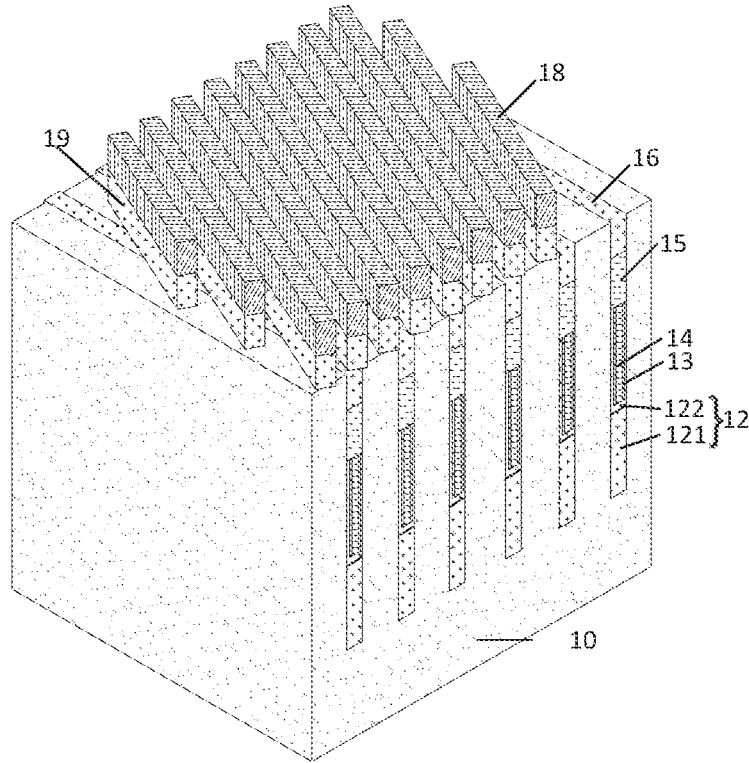
FIG. 6 is a schematic diagram of a structure including a third mask strip according to an embodiment of the present disclosure.

In an embodiment of the present disclosure, referring to FIG. 6, the third mask strips 18 may be a plurality of elongated mask strips.

In one embodiment, an isolation layer (which may be referred to as a fifth isolation layer) is deposited on the bit line structure after the bit line structure is obtained and before the first groove is formed. For example, a material of the fifth isolation layer may be silicon nitride, silicon oxide or silicon oxynitride, but is not limited thereto. Next, regions other than regions corresponding to the third mask strips 18 in the fifth isolation layer is etched to obtain the structure shown in FIG. 6. In FIG. 6, a portion obtained after the fifth isolation layer is etched may be referred to as a first isolation structure 19. Next, the plurality of third mask strips 18 are cut. That is, for each of the third mask strips 18, this third mask strip 18 is cut into a plurality of mask strips (i.e., the second mask strip in the embodiment of the present disclosure) with the preset length.

Figure 7:
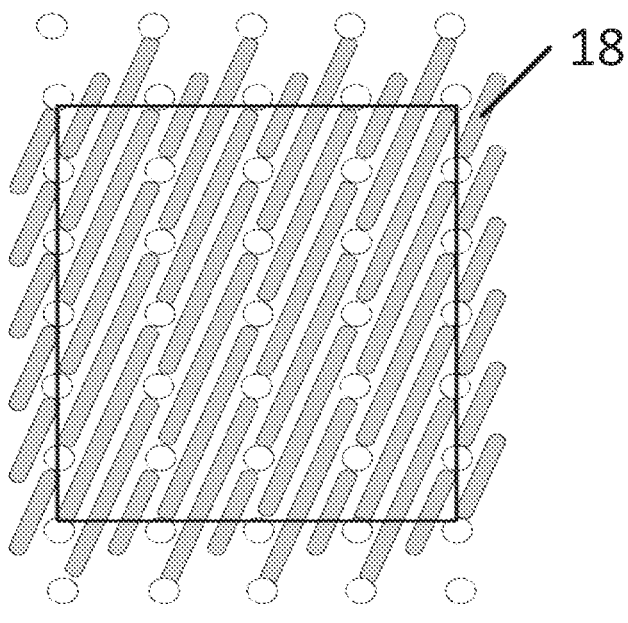
FIG. 7 is a schematic diagram of cutting the third mask strip in the structure shown in FIG. 6.
Figure 8:
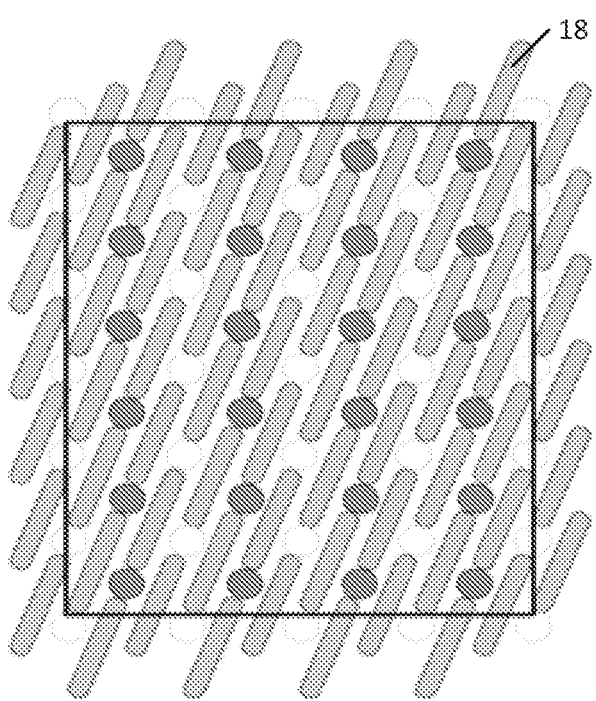
FIG. 8 is another schematic diagram of cutting the third mask strip in the structure shown in FIG. 6.
Figure 9:
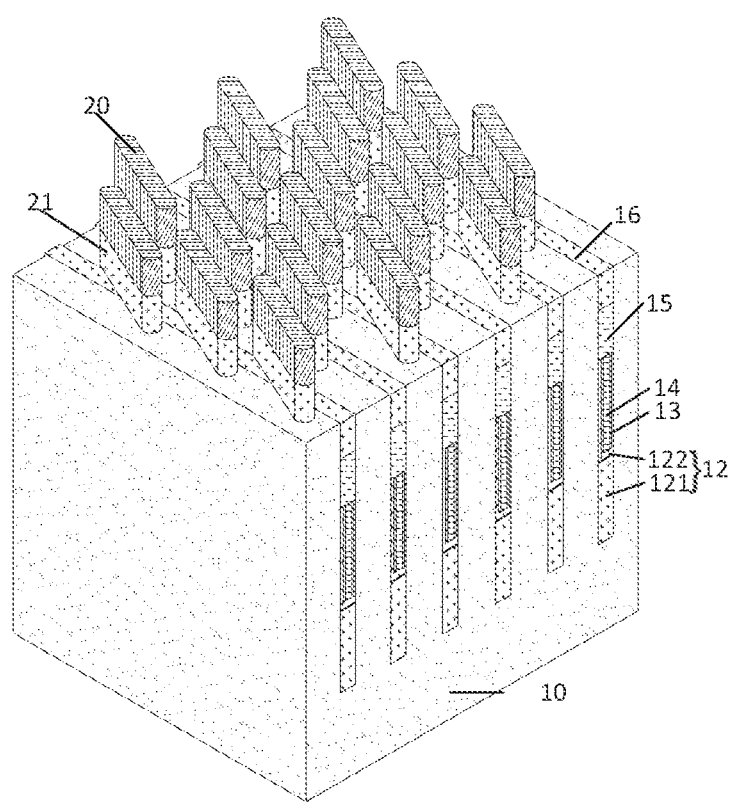
FIG. 9 is a schematic diagram of a structure obtained by etching the structure in FIG. 6 based on a second mask strip.

For example, reference is made to FIGS. 7 and 8, which are schematic diagrams of cutting the third mask strip 18 shown in FIG. 6. In one embodiment, the third mask strip 18 is cut based on the method shown in FIG. 7 to obtain the plurality of mask strips. White dots in FIG. 7 indicate cutting positions. Next, the mask strips obtained in FIG. 7 are further cut based on the method shown in FIG. 8. Gray dots in FIG. 8 indicate the cutting positions. Based on the above processing, the plurality of mask strips with the preset length can be obtained. Referring to FIG. 9, a second mask strip 20 is obtained after cutting.

Based on the second mask strip 20 in FIG. 9, the first isolation structure 19 is etched to the upper surface of the bit line structure to form a second isolation structure 21, thereby obtaining a structure shown in FIG. 9. Top of the structure shown in FIG. 9 has small island-shaped structures (i.e. the second mask strips 20 and the second isolation structures 21).

In the related technologies, before the bit line is formed, the island-shaped structure is formed first, and then a hole is formed in a center of the island-shaped structure, and doped polysilicon is deposited through the hole to form Bit Line Coupling (BLC), which leads to complicated preparation process. In contrast, according to the method for fabricating the semiconductor structure provided by the embodiments of the present disclosure, when the bit line is formed, the doped polysilicon is first directly deposited to form the BLC without forming the hole in the island-shaped structure, and thus operation can be simplified.

Regions of the substrate 10 other than the region corresponding to the second mask strip 20 is etched to form the first groove. Next, the island-shaped structure at the top is removed to obtain the structure shown in FIG. 5.

Figure 10:
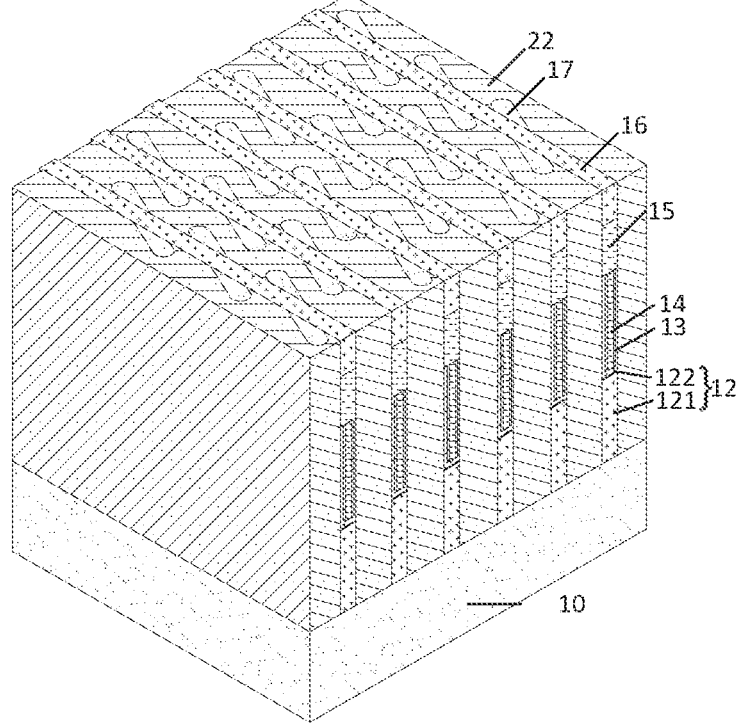
FIG. 10 is a schematic diagram of a structure obtained by filling a first groove in the structure shown in FIG. 5.

For the Step S205, in one embodiment, the second isolation layer 22 is filled in the first groove on the basis of FIG. 5 to obtain the structure (i.e., the first structure in the embodiment of the present disclosure) shown in FIG. 10. A material of the second isolation layer 22 may be silicon nitride, silicon oxide or silicon oxynitride, but is not limited thereto.

For the Step S206, the word line groove may include a plurality of portions, including a portion corresponding to the active area structure 17 (i.e., a first word line groove), a portion corresponding to the second isolation layer 22 (i.e., a second word line groove), and a portion corresponding to the bit line structure (i.e., a third word line groove).

In one embodiment, a bottom surface of the first word line groove is lower than a bottom surface of the second word line groove and a bottom surface of the third word line groove. In this way, a depth of the word line groove of the active area structure 17 is deeper than that of the word line groove of the isolation region, such that a cross-sectional area of word lines in a non-active area can be reduced, thereby reducing parasitic capacitance between the word lines and reducing parasitic capacitance between the word line and the bit line, and effectively preventing Row Hammer.

Accordingly, the word line grooves may be formed at least in the following two different manners.

In the first manner, the Step S206 includes: etching the active area structure 17 to form the first word line groove; etching the second isolation layer 22 to form the second word line groove; and etching the bit line structure to form the third word line groove.

That is, the portion corresponding to the active area structure 17, the portion corresponding to the second isolation layer 22, and the portion corresponding to the bit line structure are respectively etched to different positions, such that the bottom surface of the first word line groove is lower than the bottom surface of the second word line groove and the bottom surface of the third word line groove.

In the second manner, the Step S206 includes: etching the first structure to form, in the first structure, a plurality of second grooves extending along the direction perpendicular to the first direction, where a bottom surface of each of the plurality of second grooves is flush with a lower surface of the bit line conductive connection layer 15; and etching a portion of the second groove corresponding to the active area structure 17 to a first position to form the plurality of word line grooves in the first structure, where a bottom surface of the word line groove corresponding to the active area structure 17 is lower than the bottom surface of the word line groove corresponding to the second isolation layer 22 and the bottom surface of the word line groove corresponding to the bit line structure.

That is, the portion corresponding to the active area structure 17, the portion corresponding to the second isolation layer 22, and the portion corresponding to the bit line structure are simultaneously etched to the lower surface of the bit line conductive connection layer 15. Next, the portion corresponding to the active area structure 17 is further etched to the first position, such that the bottom surface of the word line groove corresponding to the active area structure 17 is lower than the bottom surfaces of the word line grooves corresponding to the second isolation layer 22 and the bit line structure.

In one embodiment, the bottom surface of the third word line groove is flush with or higher than the upper surface of the bit line metal line layer, which can reduce a relative area between the bit line and the word line, avoid too high parasitic capacitance, and protect the word line from breaking.

Figure 11:
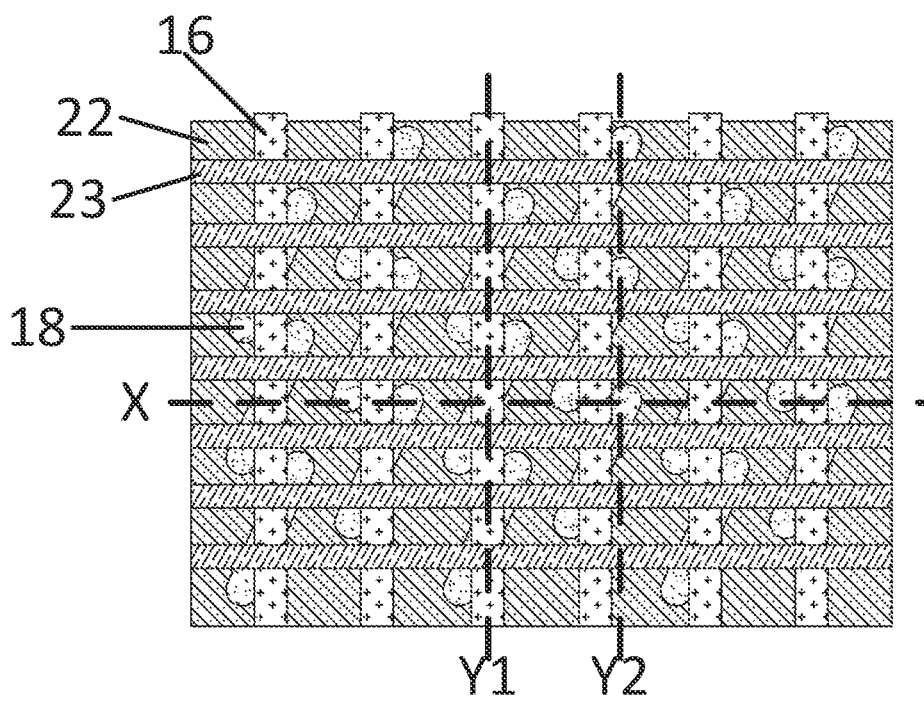
FIG. 11 is a vertical view of a structure obtained by forming a fourth mask strip on the first structure shown in FIG. 10.

In one embodiment, reference is made to FIG. 11, which is a vertical view of a structure obtained by forming a fourth mask strip on the first structure shown in FIG. 10. In FIG. 11, the fourth mask strip 23 is an elongated mask strip perpendicular to the first insulating layer 16, i.e., perpendicular to the first direction. Using the fourth mask strip 23 as a mask, the first structure below the fourth mask strip 23 is etched to form a plurality of grooves (i.e., the word line grooves in the embodiments of the present disclosure). A shape of the word line groove is consistent with that of the fourth mask strip 23.

As can be seen from FIG. 11, the word line groove includes a groove portion formed by etching the active area structure 17, a groove portion formed by etching the second isolation layer 22, and a groove portion formed by etching the bit line structure. In FIGS. 11, X, Y1 and Y2 represent three cross-sections.

Figure 12A:
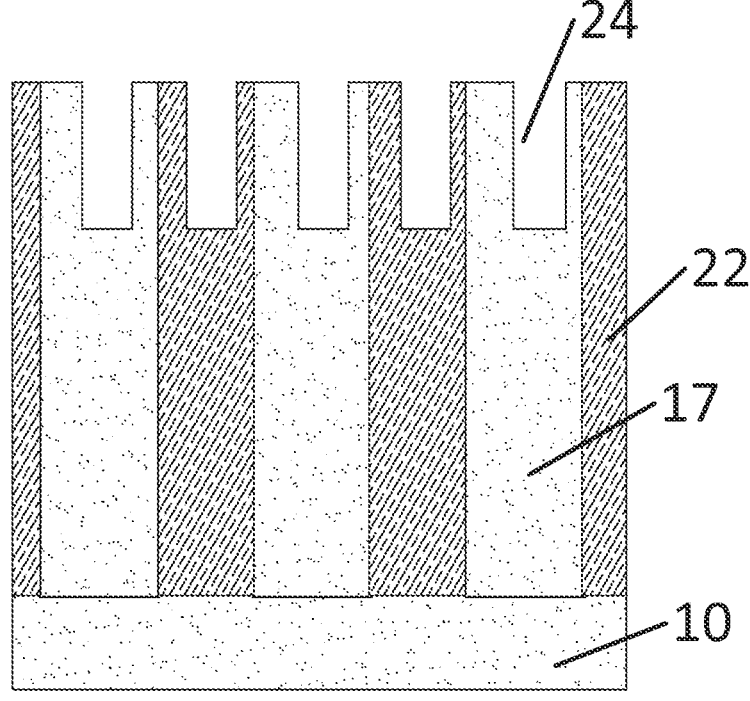
FIG. 12A is a schematic diagram of a cross-section Y2 of a second structure obtained by etching the structure shown in FIG. 11.
Figure 12B:
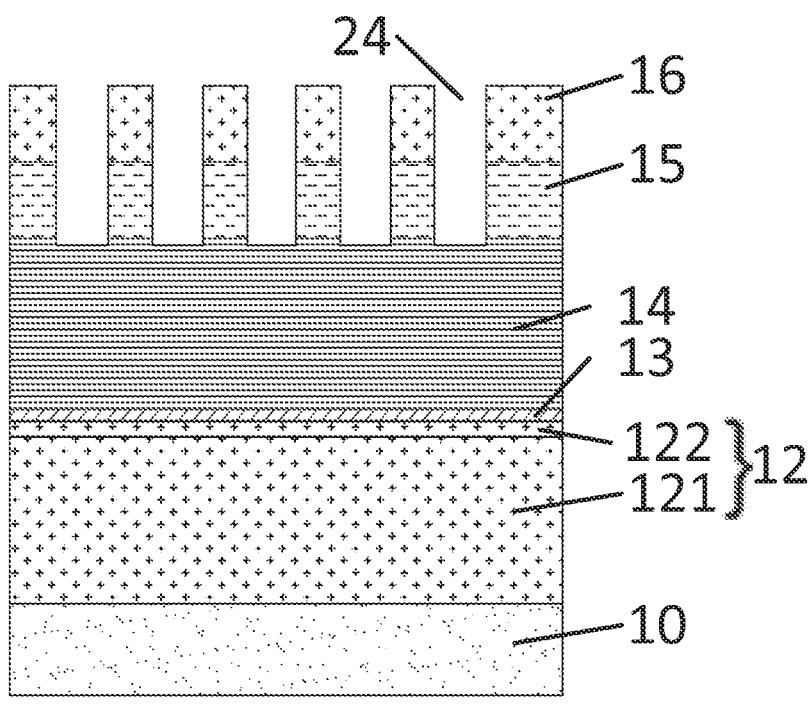
FIG. 12B is a schematic diagram of a cross-section Y1 of the second structure obtained by etching the structure shown in FIG. 11.
Figure 12C:
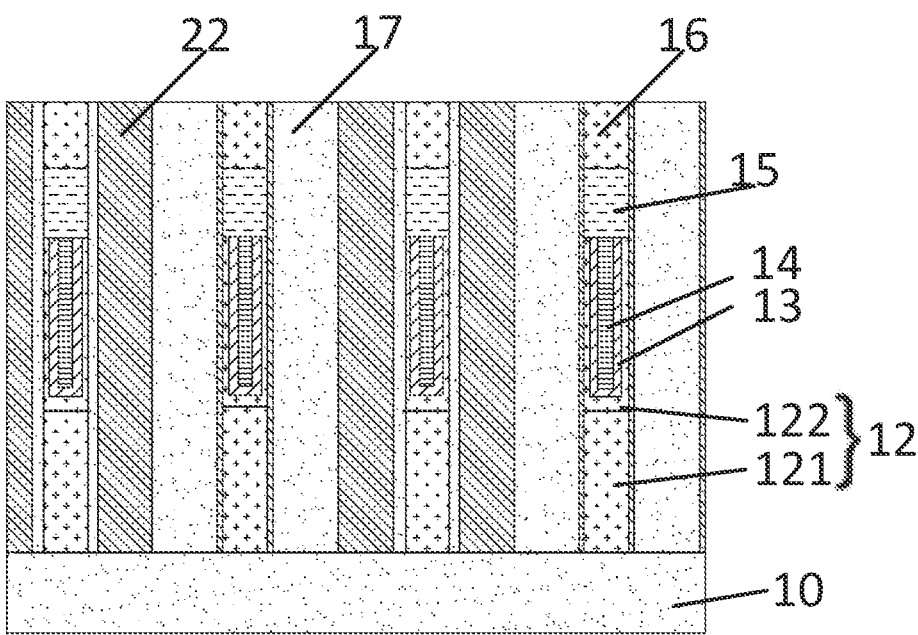
FIG. 12C is a schematic diagram of a cross-section X of the second structure obtained by etching the structure shown in FIG. 11.

For example, reference is made to FIG. 12A, which is a schematic diagram of a cross-section Y2 of a second structure obtained by etching the first structure shown in FIG. 11. In FIG. 12A, a plurality of second grooves 24 are formed, where each of the second grooves 24 includes the groove portion formed by etching the active area structure 17, the groove portion formed by etching the second isolation layer 22, and the groove portion formed by etching the bit line structure. Accordingly, reference is made to FIG. 12B, which is a schematic diagram of a cross-section Y1 of the second structure obtained by etching the first structure shown in FIG. 11. Reference is made to FIG. 12C, which is a schematic diagram of a cross-section X of the second structure obtained by etching the first structure shown in FIG. 11.

Next, portions of the plurality of second grooves 24 corresponding to the active area structures 17 are determined. That is, the second grooves 24 formed by etching the active area structures 17 are determined. Next, the portions of the second grooves 24 corresponding to the active area structures 17 are further etched to the first position to obtain a structure (which may be referred to as a third structure)

where the word line grooves are formed. The first position is higher than the bottom of the substrate 10.

Figure 13A:
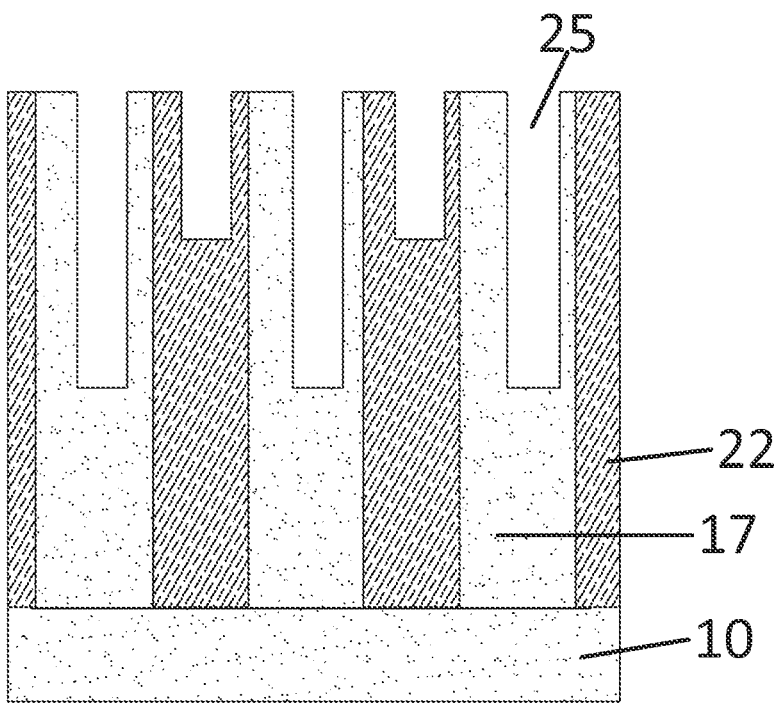
FIG. 13A is a schematic diagram of the cross-section Y2 of a third structure obtained by etching the structure shown in FIG. 11.
Figure 13B:
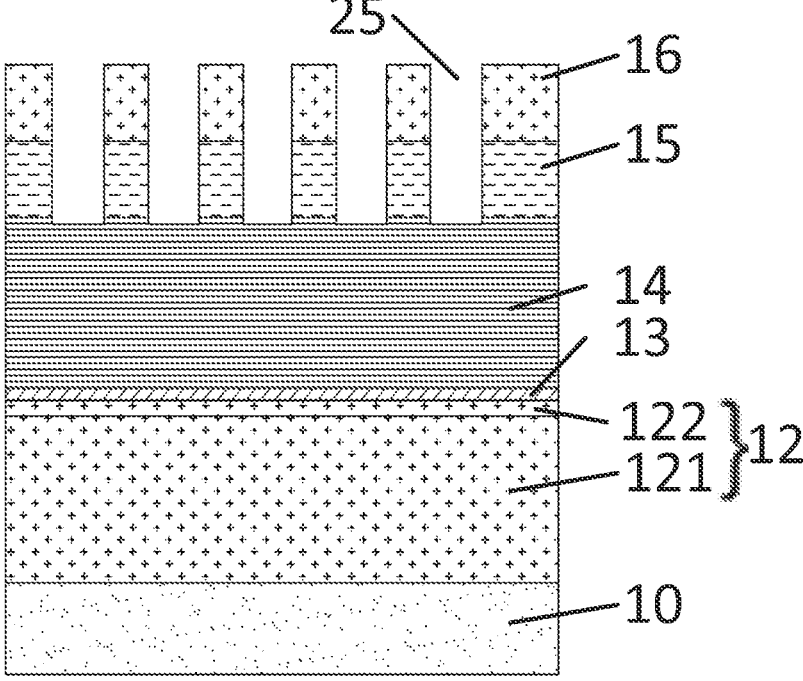
FIG. 13B is a schematic diagram of the cross-section Y1 of the third structure obtained by etching the structure shown in FIG. 11.
Figure 13C:
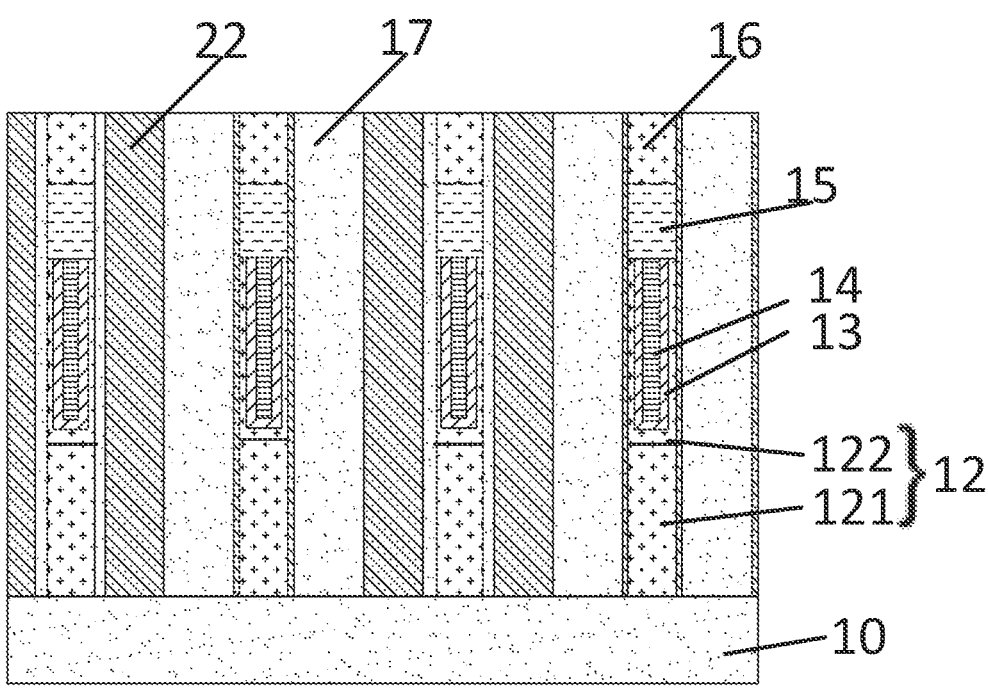
FIG. 13C is a schematic diagram of the cross-section X of the third structure obtained by etching the structure shown in FIG. 11.

Reference is made to FIG. 13A, which is a schematic diagram of a cross-section Y2 of the third structure obtained by etching the first structure shown in FIG. 11. In FIG. 13A, the depth of the word line groove 25 in the active area structure 17 is greater than that of the word line groove 25 in the second isolation layer 22. Accordingly, reference is made to FIG. 13B, which is a schematic diagram of a cross-section Y1 of the third structure obtained by etching the first structure shown in FIG. 11. Reference is made to FIG. 13C, which is a schematic diagram of a cross-section X of the third structure obtained by etching the first structure shown in FIG. 11.

Based on the above processing, the depth of the word line groove in the active area structure 17 is deeper than that of the word line groove of the isolation region, such that the cross-sectional area of the word lines in the non-active area can be reduced, thereby reducing the parasitic capacitance between the word lines and reducing the parasitic capacitance between the word line and the bit line, and effectively preventing the Row Hammer.

In one embodiment, the Step S207 may include following steps.

In Step 1, a third isolation layer 26 is deposited on the bottom and a side wall of each of the plurality of word line grooves 25.

In Step 2, a first sub word line conductive connection layer 271 is deposited on the bottom and the side wall of each of the plurality of word line grooves 25 where the third isolation layer 26 is formed.

In Step 3, a second sub word line conductive connection layer 272 is deposited in the plurality of word line grooves where the first sub word line conductive connection layer 271 is formed.

In Step 4, the first sub word line conductive connection layer 271 and the second sub word line conductive connection layer 272 are etched back to a second position above the bit line metal line layer to form a word line conductive connection layer 27.

In Step 5, a second insulating layer 28 is deposited in each of the plurality of word line grooves 25 where the word line conductive connection layer 27 is formed.

The first sub word line conductive connection layer 271 and the second sub word line conductive connection layer 272 are etched back to the second position above the bit line metal line layer to form the word line conductive connection layer 27, and the structure obtained may be referred to as a fourth structure. The structure obtained by the Steps 1 to 5 may be referred to as a target structure.

Figure 14:
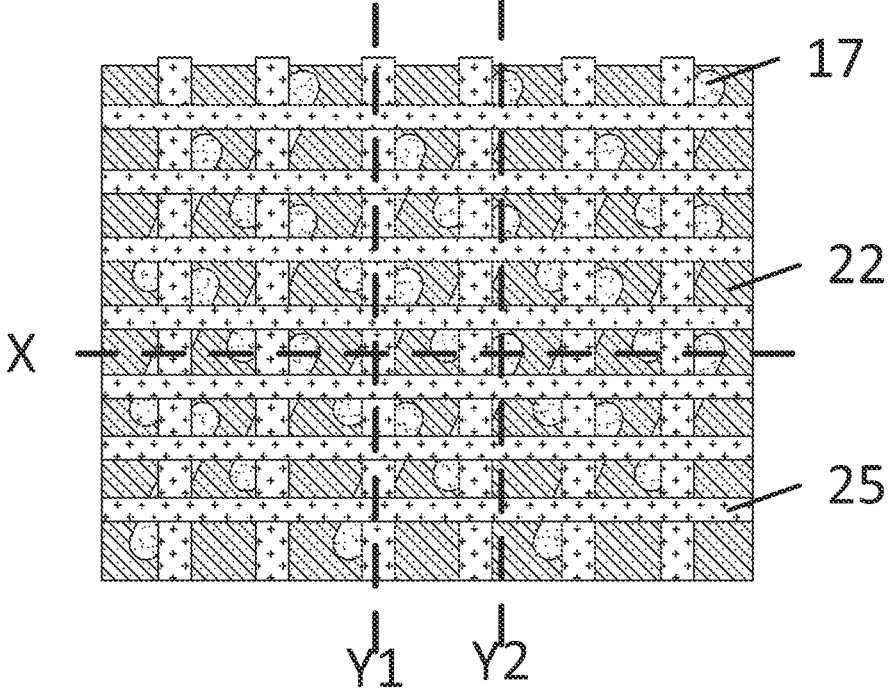
FIG. 14 is a vertical view of the third structure obtained based on the structure shown in FIG. 11.

In an embodiment of the present disclosure, reference is made to FIG. 14, which is a vertical view of the third structure based on the first structure shown in FIG. 11. In FIGS. 14, X, Y1 and Y2 represent three cross-sections.

Figure 15A:
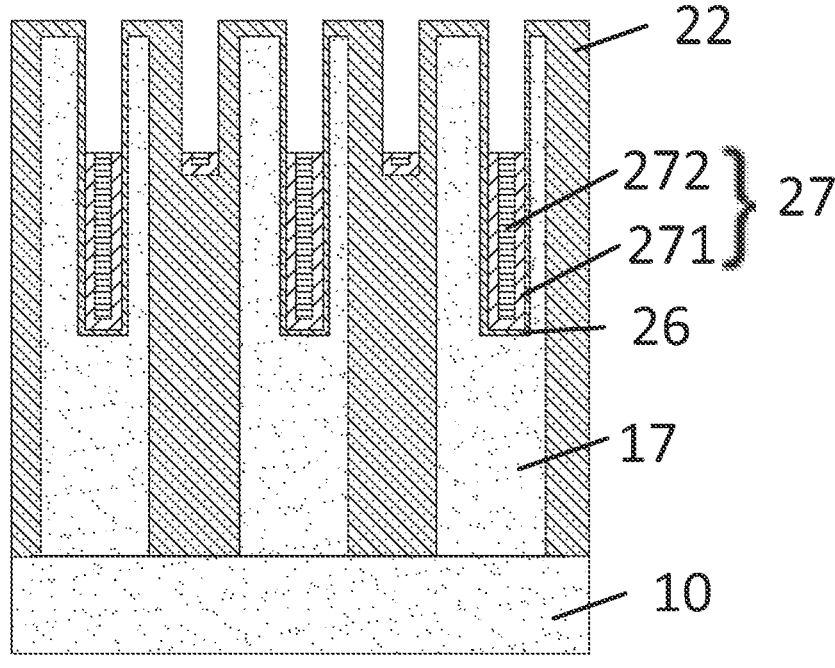
FIG. 15A is a schematic diagram of the cross-section Y2 of a fourth structure obtained based on the structure shown in FIG. 14.
Figure 15B:
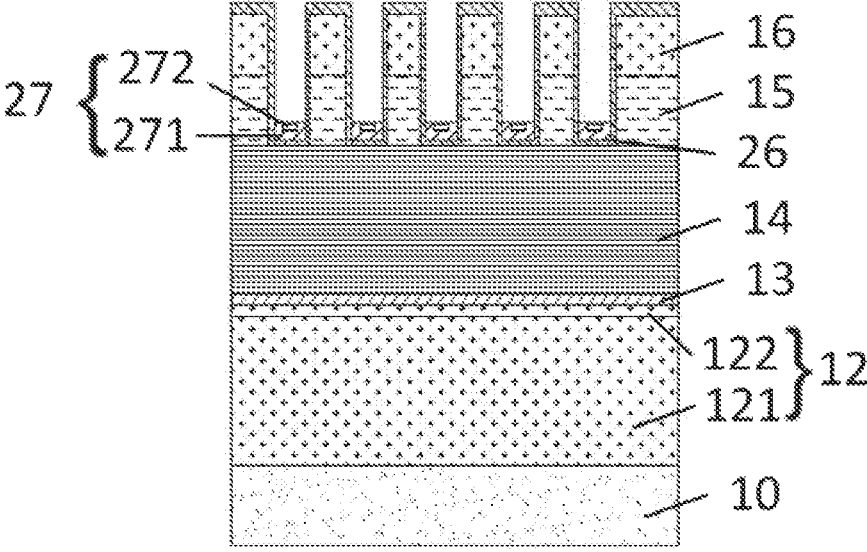
FIG. 15B is a schematic diagram of the cross-section Y1 of the fourth structure obtained based on the structure shown in FIG. 14.
Figure 15C:
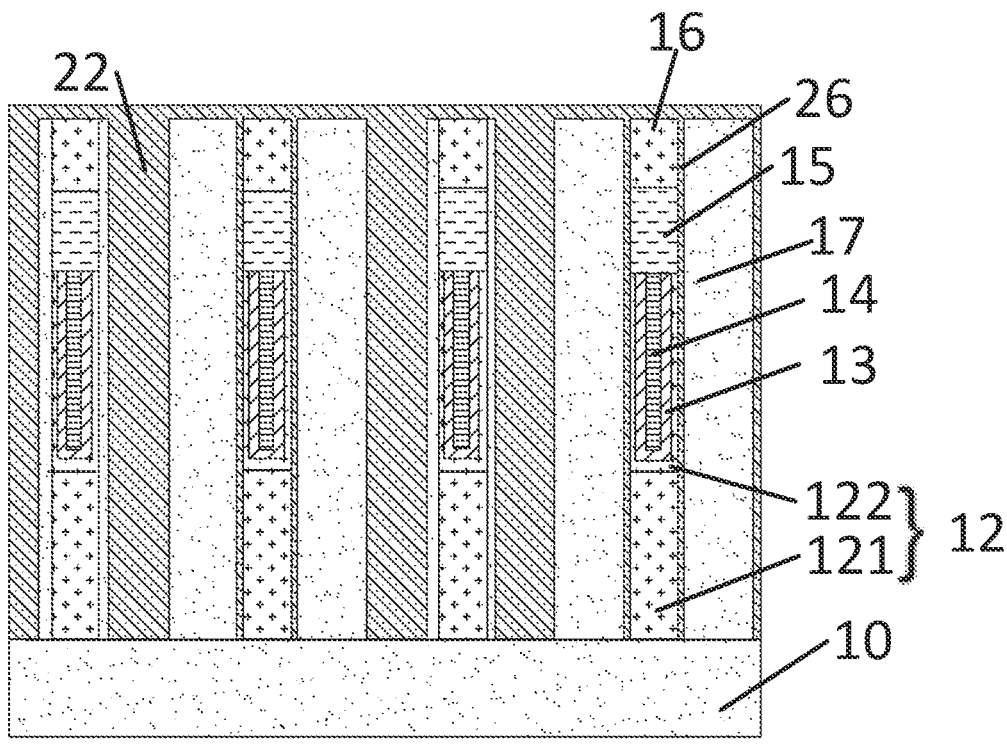
FIG. 15C is a schematic diagram of the cross-section X of the fourth structure obtained based on the structure shown in FIG. 14.

Accordingly, FIG. 15A is a schematic diagram of the cross-section Y2 of the fourth structure obtained based on the third structure shown in FIG. 14. FIG. 15B is a schematic diagram of the cross-section Y1 of the fourth structure obtained based on the third structure shown in FIG. 14. FIG. 15C is a schematic diagram of the cross-section X of the fourth structure obtained based on the third structure shown in FIG. 14.

After the plurality of word line grooves 25 are formed, the third isolation layer 26 is deposited on the bottom and the side wall of each of the plurality of word line grooves 25, to serve as a gate oxide layer of the word line. A material of the third isolation layer 26 may be silicon oxide, silicon nitride or silicon oxynitride, but is not limited thereto.

Next, the first sub word line conductive connection layer 271 is deposited on the third isolation layer 26 formed. A material of the first sub word line conductive connection layer 271 may be titanium nitride or cobalt, but is not limited thereto. Next, remaining space of the word line groove 25 is filled with the second sub word line conductive connection layer 272. A material of the second sub word line conductive connection layer 272 may be tungsten, cobalt silicide or titanium, but is not limited thereto.

In addition, after the second sub word line conductive connection layer 272 is filled, the first sub word line conductive connection layer 271 and the second sub word line conductive connection layer 272 are etched back, i.e. etched to the second position. The first sub word line conductive connection layer 271 and the second sub word line conductive connection layer 272 etched constitute the word line conductive connection layer 27. The second position may be determined by the technician according to the dimension of the semiconductor structure and the actual fabrication requirements. The second position may be lower than the top of the bit line conductive connection layer 15 and higher than the bottom of the bit line conductive connection layer 15.

In one embodiment, the second position may be close to the bottom of the bit line conductive connection layer 15. For example, the second position is lower than a midpoint of the bit line conductive connection layer 15 and is higher than the bottom of the bit line conductive connection layer 15.

Figure 16A:
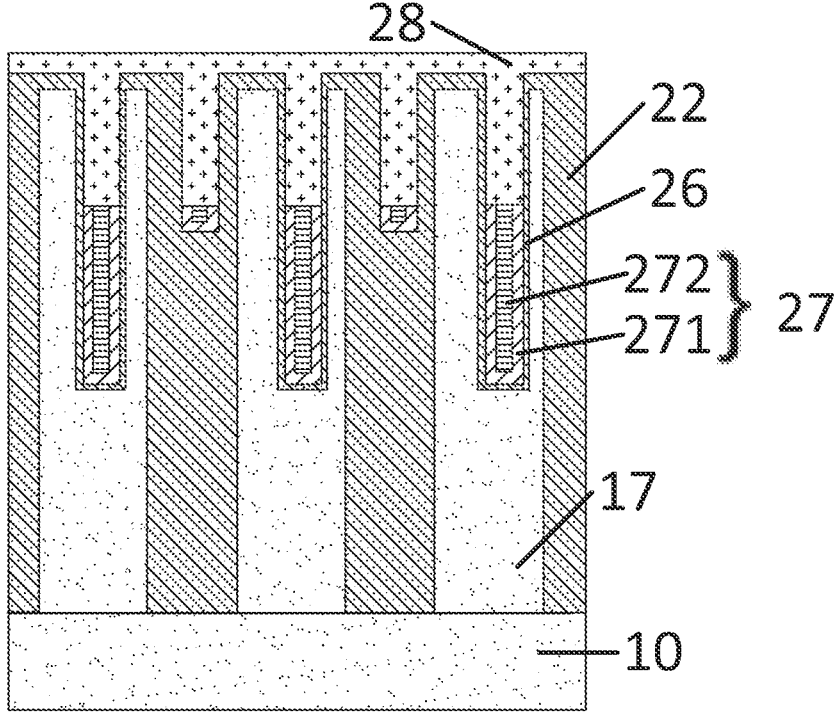
FIG. 16A is a schematic diagram of the cross-section Y2 of a target structure obtained based on the structure shown in FIG. 14.
Figure 16B:
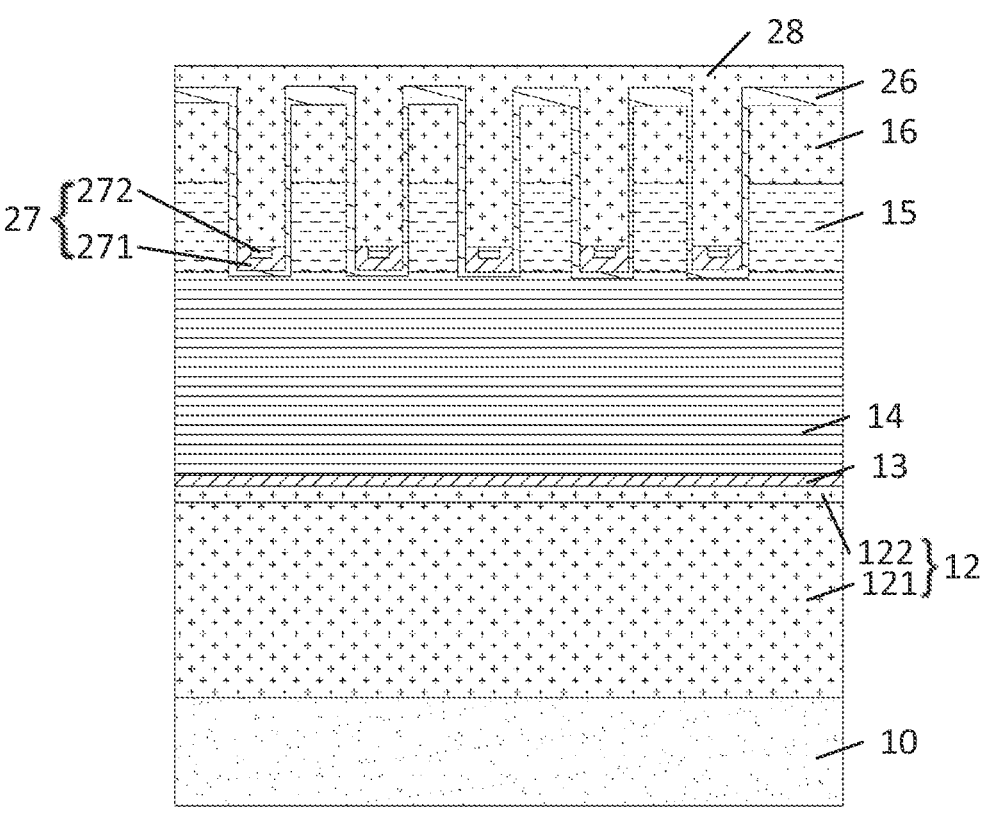
FIG. 16B is a schematic diagram of the cross-section Y1 of the target structure obtained based on the structure shown in FIG. 14.
Figure 16C:
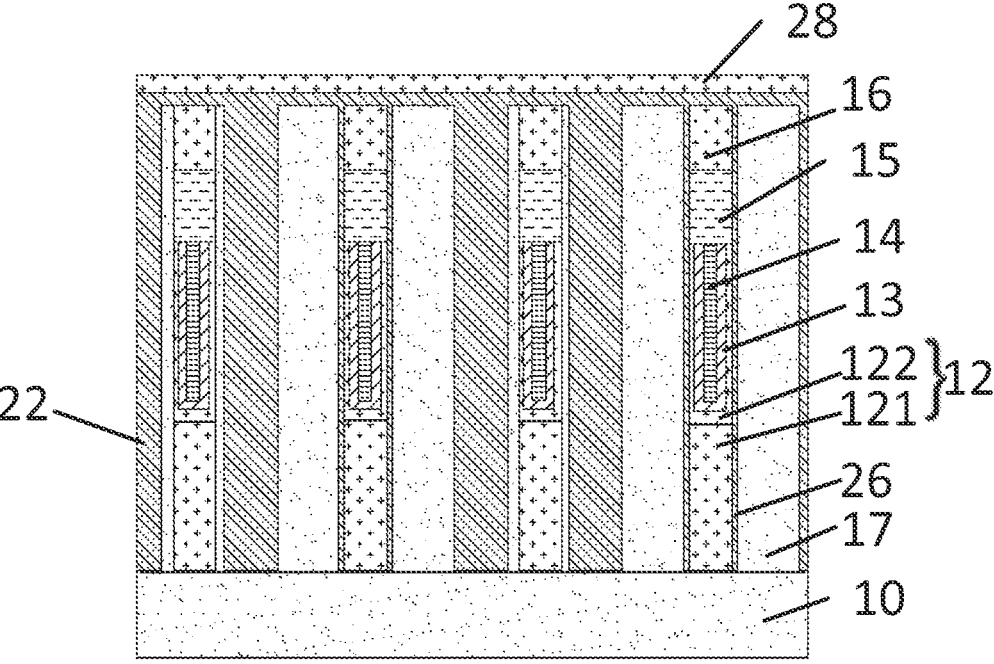
FIG. 16C is a schematic diagram of the cross-section X of the target structure obtained based on the structure shown in FIG. 14.

Further, referring to FIG. 16A, FIG. 16B and FIG. 16C, FIG. 16A is a schematic diagram of the cross-section Y2 of the target structure obtained based on the fourth structure shown in FIG. 15. FIG. 16B is a schematic diagram of the cross-section Y1 of the target structure obtained based on the fourth structure shown in FIG. 15. FIG. 16C is a schematic diagram of the cross-section X of the target structure obtained based on the fourth structure shown in FIG. 15.

The second insulating layer 28 is deposited on the word line conductive connection layer 27 formed in the word line groove 25 to obtain the semiconductor structure. The second insulating layer 28 is configured to protect the word lines formed from being oxidized. A material of the second insulating layer 28 may be silicon nitride, silicon oxide or silicon oxynitride, but is not limited thereto.

Based on the method for fabricating the semiconductor structure, an embodiment of the present disclosure also provides a semiconductor structure, which includes:

a substrate 10 comprising a plurality of active area structures 17 arranged at intervals; a plurality of bit line structures formed in the substrate 10 and extending along a first direction, where each of the plurality of bit line structures includes a first isolation layer 12, a bit line metal line layer, a bit line conductive connection layer 15 and a first insulating layer 16 sequentially distributed from bottom to top, and each of the plurality of bit line structures intersects with the plurality of active area structures 17, respectively; a second isolation layer 22 arranged between the plurality of bit line structures; and a plurality of word line structures formed in the substrate 10 and extending along a direction perpendicular to the first direction, where each of the plurality of word line structures includes a third isolation layer 26, a word line conductive connection layer 27 and a second insulating layer 28 sequentially distributed from bottom to top.

In one embodiment, each word line structure includes a first portion corresponding to the active area structure 17, a second portion corresponding to the second isolation layer 22, and a third portion corresponding to the bit line structure. A lower surface of the first portion is lower than a lower surface of the second portion and a lower surface of the third portion. In this way, the depth of the word line groove of the active area structure 17 is deeper than that of the word line groove of the isolation region, such that the cross-sectional area of the word lines in the non-active area can be reduced, thereby reducing the parasitic capacitance between the word lines and reducing the parasitic capacitance between the word line and the bit line, and effectively preventing the Row Hammer.

In one embodiment, the lower surface of the third portion is flush with or higher than the upper surface of the bit line metal line layer; and the upper surface of the word line conductive connection layer 27 is higher than the lower surface of the second portion and the lower surface of the third portion. In this way, the relative area between the bit line and the word line can be reduced, the parasitic capacitance can be avoided from being too high, and the word line can be protected from breaking.

In one embodiment, the upper surface of the word line conductive connection layer 27 is lower than the midpoint of the bit line conductive connection layer 15 and is higher than the lower surface of the bit line conductive connection layer 15.

In one embodiment, the angle between the bit line structure and the active area structure 17 is between 15° and 30°.

It is to be noted that a relational term (such as a first or a second . . . ) herein is merely intended to separate one entity or operation from another entity or operation instead of requiring or hinting any practical relation or sequence exists among these entities or operations. Furthermore, terms such as "comprise", "include" or other variants thereof are intended to cover a non-exclusive "include" such that a process, a method, a merchandise or a device comprising a series of elements not only includes these elements, but also includes other elements not listed explicitly, or also includes inherent elements of the process, the method, the merchandise or the device. In the case of no more restrictions, elements restricted by a sentence "include a . . . " do not exclude the fact that additional identical elements may exist in a process, a method, a merchandise or a device of these elements.

The embodiments of this specification are described in a progressive manner, and the same or similar parts between the embodiments may be referred to each other, and each of the embodiments focuses on differences from other embodiments. The above are merely exemplary embodiments of the present disclosure, and are not intended to limit the scope of protection of the present disclosure. All modifications, equivalent substitutions and improvements made within the spirit and principle of the present disclosure shall fall within the protection scope of the present disclosure.

What is claimed is:

1. A method for fabricating a semiconductor structure comprising:

providing a substrate;

etching the substrate to form, in the substrate, a plurality of bit line grooves extending along a first direction;

sequentially forming a first isolation layer, a bit line metal line layer, a bit line conductive connection layer and a first insulating layer in each of the plurality of bit line grooves to obtain a bit line structure;

etching the substrate in which the bit line structure is formed to obtain a plurality of active area structures arranged at intervals and a first groove, wherein the bit line structure intersects with the plurality of active area structures, respectively;

filling the first groove with a second isolation layer to obtain a first structure;

etching the first structure to form, in the first structure, a plurality of word line grooves extending along a direction perpendicular to the first direction; and sequentially forming a third isolation layer, a word line conductive connection layer and a second insulating layer in each of the plurality of word line grooves.

2. The method according to claim 1, wherein the first isolation layer comprises a first sub isolation layer and a second sub isolation layer; and the sequentially forming the first isolation layer, the bit line metal line layer, the bit line conductive connection layer and the first insulating layer in each of the plurality of bit line grooves to obtain the bit line structure comprises:

depositing the first sub isolation layer on a bottom of each of the plurality of bit line grooves;

depositing a second sub isolation layer on the bottom and a side wall of each of the plurality of bit line grooves where the first sub isolation layer is formed;

depositing a barrier layer on the bottom and the side wall of each of the plurality of bit line grooves where the second sub isolation layer is formed;

depositing a bit line metal line material layer in each of the plurality of bit line grooves where the barrier layer is formed;

etching back the barrier layer and the bit line metal line material layer to obtain the bit line metal line layer;

depositing the bit line conductive connection layer in each of the plurality of bit line grooves where the bit line metal line layer is formed; and depositing the first insulating layer in each of the plurality of bit line grooves where the bit line conductive connection layer is formed to obtain the bit line structure.

3. The method according to claim 1, wherein each of the plurality of word line grooves comprises a first word line groove, a second word line groove, and a third word line groove; and the etching the first structure to form, in the first structure, the plurality of word line grooves extending along the direction perpendicular to the first direction comprises:

etching each of the plurality of active area structures to form the first word line groove;

etching the second isolation layer to form the second word line groove; and etching the bit line structure to form the third word line groove;

wherein a bottom surface of the first word line groove is lower than a bottom surface of the second word line groove and a bottom surface of the third word line groove.

4. The method according to claim 3, wherein the bottom surface of the third word line groove is flush with or higher than an upper surface of the bit line metal line layer; and an upper surface of the word line conductive connection layer is higher than the bottom surface of the second word line groove and the bottom surface of the third word line groove.

5. The method according to claim 1, wherein the etching the first structure to form, in the first structure, the plurality of word line grooves extending along the direction perpendicular to the first direction comprises:

etching the first structure to form, in the first structure, a plurality of second grooves extending along the direction perpendicular to the first direction, where a bottom surface of each of the plurality of second grooves is flush with a lower surface of the bit line conductive connection layer; and etching a portion of a given one of the plurality of second grooves corresponding to a given one of the plurality of active area structures to a first position to form the plurality of word line grooves in the first structure, wherein a bottom surface of a given one of the plurality of word line grooves corresponding to the given active area structure is lower than a bottom surface of a given one of the plurality of word line grooves corresponding to the second isolation layer and a bottom surface of a given one of the plurality of word line grooves corresponding to the bit line structure.

6. The method according to claim 1, wherein the etching the substrate to form, in the substrate, the plurality of bit line grooves extending along the first direction comprises:

forming a first mask layer on the substrate, wherein the first mask layer comprises a plurality of first mask strips extending along the first direction, and the plurality of first mask strips are parallel to each other; and etching the substrate covered by the first mask layer to form, in the substrate, a plurality of bit line grooves extending along the first direction.

7. The method according to claim 1, wherein the etching the substrate in which the bit line structure is formed to obtain the plurality of active area structures arranged at intervals and the first groove comprises:

forming a second mask layer on the substrate where the bit line structure is formed; and etching the substrate covered by the second mask layer to obtain the plurality of active area structures arranged at intervals and the first groove;

wherein the second mask layer comprises a plurality of second mask strips arranged at intervals, and a region of each of the plurality of second mask strips intersects with a region of the bit line structure.

8. The method according to claim 7, wherein before the etching the substrate covered by the second mask layer to obtain the plurality of active area structures arranged at intervals and the first groove, the method further comprises:

providing a third mask layer comprising a plurality of third mask strips extending along a second direction, the plurality of third mask strips being parallel to each other; and cutting each of the plurality of third mask strips into the plurality of second mask strips with a preset length.

9. The method according to claim 8, wherein an angle between the first direction and the second direction is between 15° and 30°.

10. The method according to claim 1, wherein the sequentially forming the third isolation layer, the word line conductive connection layer and the second insulating layer in each of the plurality of word line grooves comprises:

depositing a third isolation layer on a bottom and a side wall of each of the plurality of word line grooves;

depositing a first sub word line conductive connection layer on the bottom and the side wall of each of the plurality of word line grooves where the third isolation layer is formed;

depositing a second sub word line conductive connection layer in each of the plurality of word line grooves where the first sub word line conductive connection layer is formed;

etching back the first sub word line conductive connection layer and the second sub word line conductive connection layer to a second position above the bit line metal line layer, to form the word line conductive connection layer; and depositing a second insulating layer in each of the plurality of word line grooves where the word line conductive connection layer is formed.

11. The method according to claim 10, wherein the second position is lower than a midpoint of the bit line conductive connection layer and higher than a lower surface of the bit line conductive connection layer.

12. The semiconductor structure according to claim 1, wherein the plurality of word line structures are formed in a plurality of word line grooves, wherein each of the plurality of word line grooves comprises a first word line groove in the plurality of active area structures, a second word line groove in the second isolation layer, and a third word line groove in the bit line structure; and each of the first portion is formed in a corresponding first word line groove, each of the second portion is formed in a corresponding second word line groove, and each of the third portion is formed in a corresponding third word line groove.

13. The semiconductor structure according to claim 12, wherein a depth of the word line groove in the active area structures is deeper than that of the word line groove in the second isolation layer.

14. The method according to claim 1, wherein a depth of the word line groove in the active area structures is deeper than that of the word line groove in the second isolation layer.

\* \* \* \* \*